United States Patent [19]

Desperques-Volmier

[11] 4,119,857
[45] Oct. 10, 1978

[54] SYSTEM FOR PROGRAMMED DRAWING BY PARTICLE BOMBARDMENT

[75] Inventor: Serge Desperques-Volmier, Paris, France

[73] Assignee: Thomson-CSF, Paris, France

[21] Appl. No.: 762,796

[22] Filed: Jan. 25, 1977

[30] Foreign Application Priority Data

Jan. 30, 1976 [FR] France .................................. 76 02585

[51] Int. Cl.² ............................................. H01J 29/00
[52] U.S. Cl. .................................. 250/492 A; 250/398
[58] Field of Search ... 364/200 MS File, 900 MS File, 364/521, 523; 235/151.2; 346/158, 161, 110; 340/324 A; 178/15, 30; 250/492 R, 492 A, 492 B, 398, 396

[56] References Cited

U.S. PATENT DOCUMENTS

| 3,382,487 | 5/1968 | Sharon | 364/900 |
|---|---|---|---|
| 3,465,295 | 9/1969 | Witt | 364/200 |
| 3,569,951 | 3/1971 | Lavenir | 340/324 A |
| 3,590,150 | 6/1971 | McMahon | 346/110 |
| 3,594,759 | 7/1971 | Smura | 346/110 |
| 3,597,757 | 8/1971 | Vincent-Carrefour | 340/324 A |
| 3,735,389 | 5/1973 | Tarczy-Hornoch | 340/324 A |
| 3,815,094 | 6/1974 | Smith | 364/200 |
| 4,051,381 | 9/1977 | Trotel | 250/492 A |

Primary Examiner—James D. Thomas
Attorney, Agent, or Firm—Cushman, Darby & Cushman

[57] ABSTRACT

A system capable of automatically producing drawings on a very small scale, comprises an electron optical system which forms a highly reduced elemental image from a diaphragm. A scanning system enables this image to be displaced line-by-line in a first direction over the recording surface and a mechanical system displacing the surface in a direction perpendicular to the first. The whole is controlled by a logic system which delivers code numbers indicating the programme to be executed for each line.

4 Claims, 8 Drawing Figures

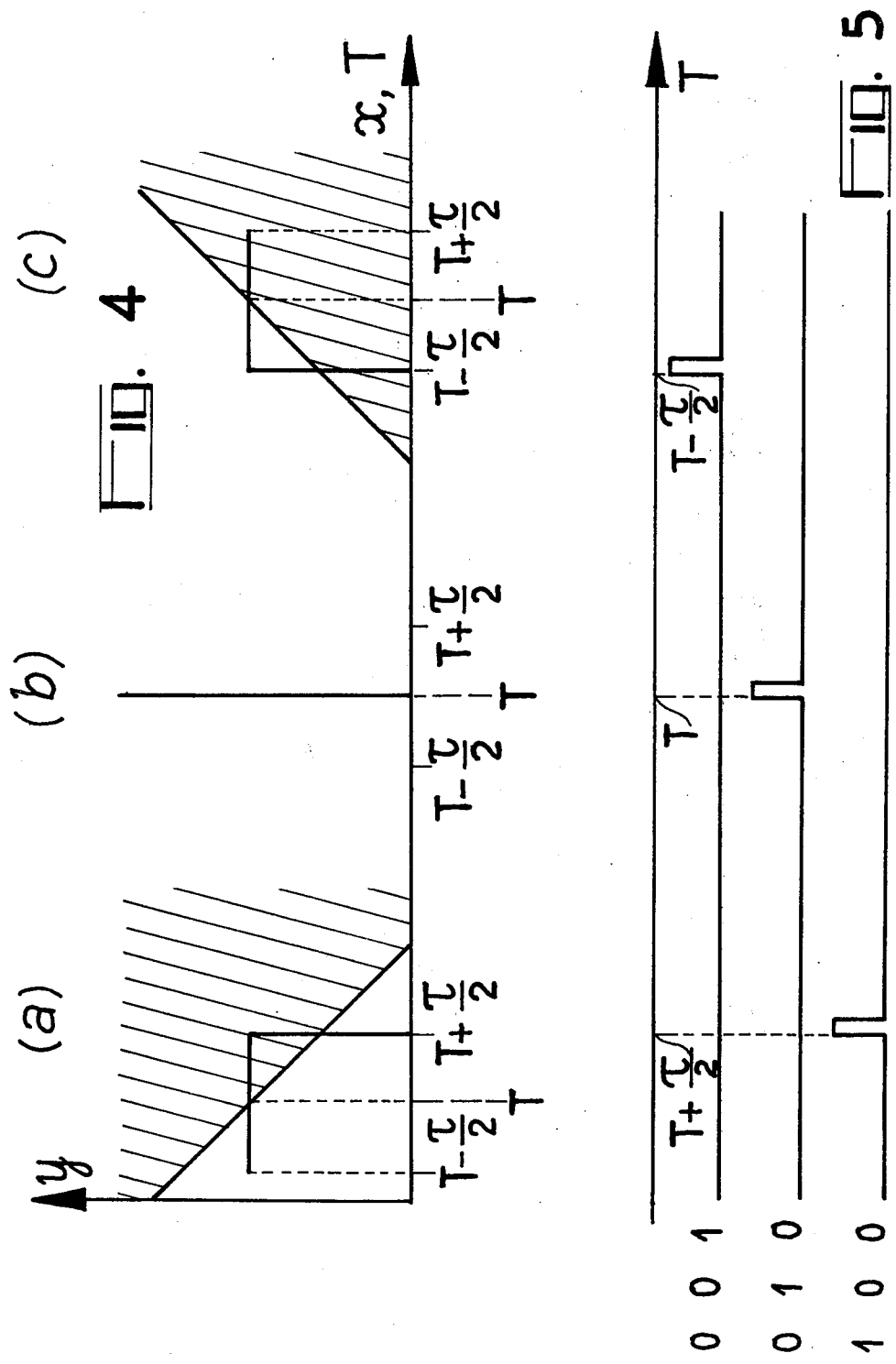

FIG. 6

|  | | |
|---|---|---|
| $x_{j-1}$ $A_{j-1}$ $B_{j-1}$ $C_{j-1}$ | $x_j$ $A_j$ $B_j$ $C_j$ | $x_{j+1}$ $A_{j+1}$ $B_{j+1}$ $C_{j+1}$ |
| $x_{j-1}$ $A_j$ $B_{j-1}$ $C_{j+2}$ | $x_j$ $A_{j+1}$ $B_j$ $C_{j-1}$ | $x_{j+1}$ $A_{j+2}$ $B_{j+1}$ $C_j$ |
| $y_q$ | | |
| $y_{q+1}$ | | |

Fig. 7

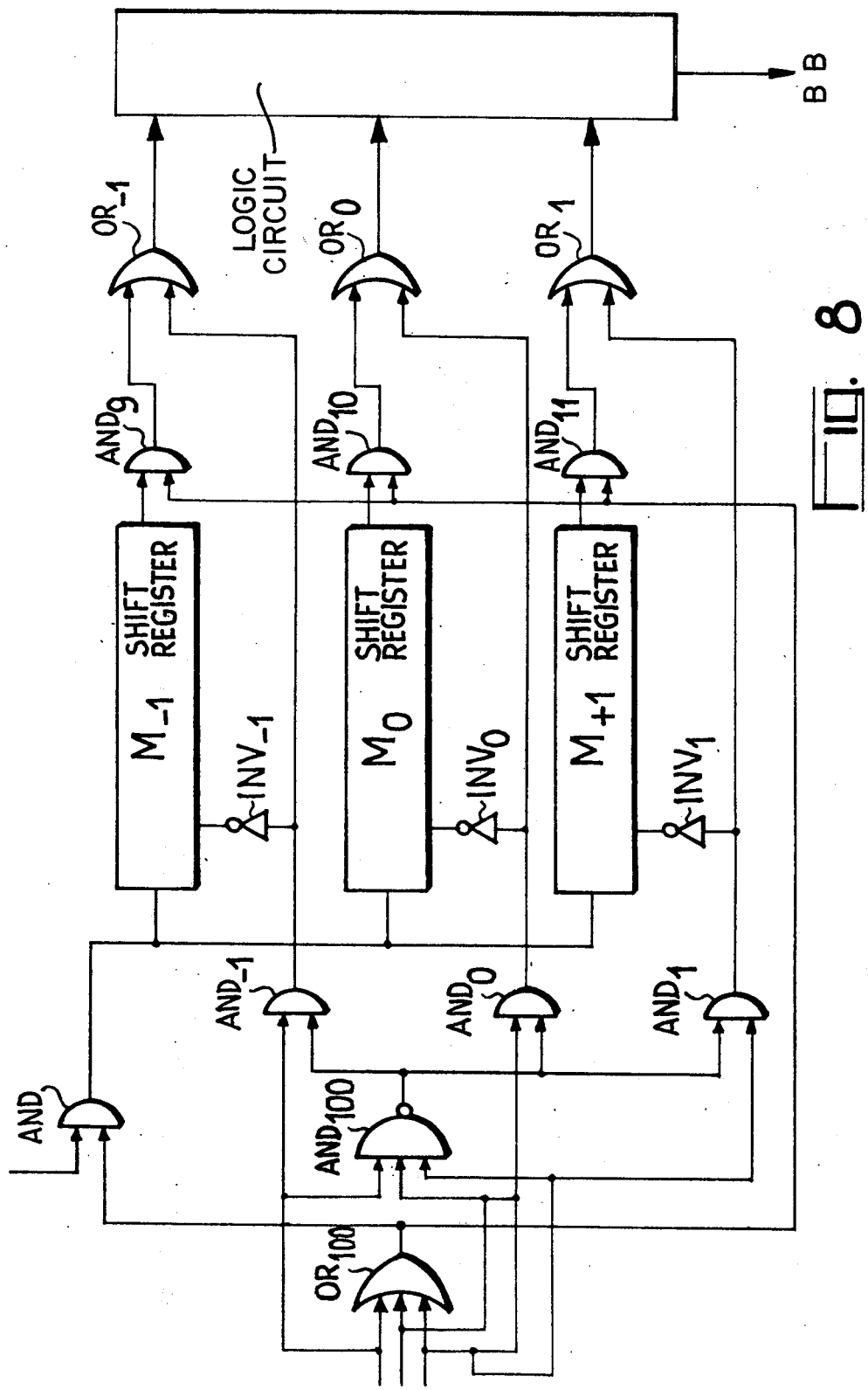

SYSTEM FOR PROGRAMMED DRAWING BY PARTICLE BOMBARDMENT

SUMMARY OF THE INVENTION

This invention has for object an improvement to the "Device for the programmed tracing or designs by particle bombardment" described in the U.S. Pat. No. 4,051,381 filed by the same Assignee. This device comprise an electron optical system forming an elementary image of extremely small dimensions, this image being the image upon a sample of a diaphragm. A scanning system makes its possible to displace this image in a first direction OX, over the surface to be printed, while a mechanical system displaces the surface in a direction perpendicular to the direction OX. The arrangement is controlled by a data processing system. A logic system receives from said data processing system code numbers, indicating the programme to to be followed line by line. The succession of the lines defines a polygonal contour, the code numbers indicating the slopes of respectives sides of the contour. The present invention has for precise object an improvement of this logic system which is described FIG. 7 of this Patent.

This invention relates to a system for programmed drawing by particle bombardment of the type described the U.S. Pat. No. 4,051,381, this patent having for priority data the French Application SN 74 41 130 filed Dec. 13, 1974 by the same Assignee. This Patent will he designed hereinafter by "the Patent".

The invention has for precise object an improvement of the interface logic system described FIG. 7 of this Patent.

It is remembered that the Patent has for object an electron optic system which by successive scanning of different line and by modulating in all or nothing fashion the intensity of the beam, describes a polygonal contour such as that shown FIG. 4 of the Patent, the sides of the contour having predetermined slopes each being produced as shown FIG. 5 of the Patent.

In this system, the interface logic is fairly complicated which limits its speed of execution.

In this system the beam is controlled by an assembly of shift register memories, each of which delivers a digit 0 or 1 at each address, the number formed in binary code by the digits respectively supplied by these memories being indicative of the slopes of the contours to be drawn.

FIG. 4 shows the drawing mode of the three types of slopes.

FIG. 5 shows the signals transmitted to the bistable circuit controlling the switching.

Figure 6:
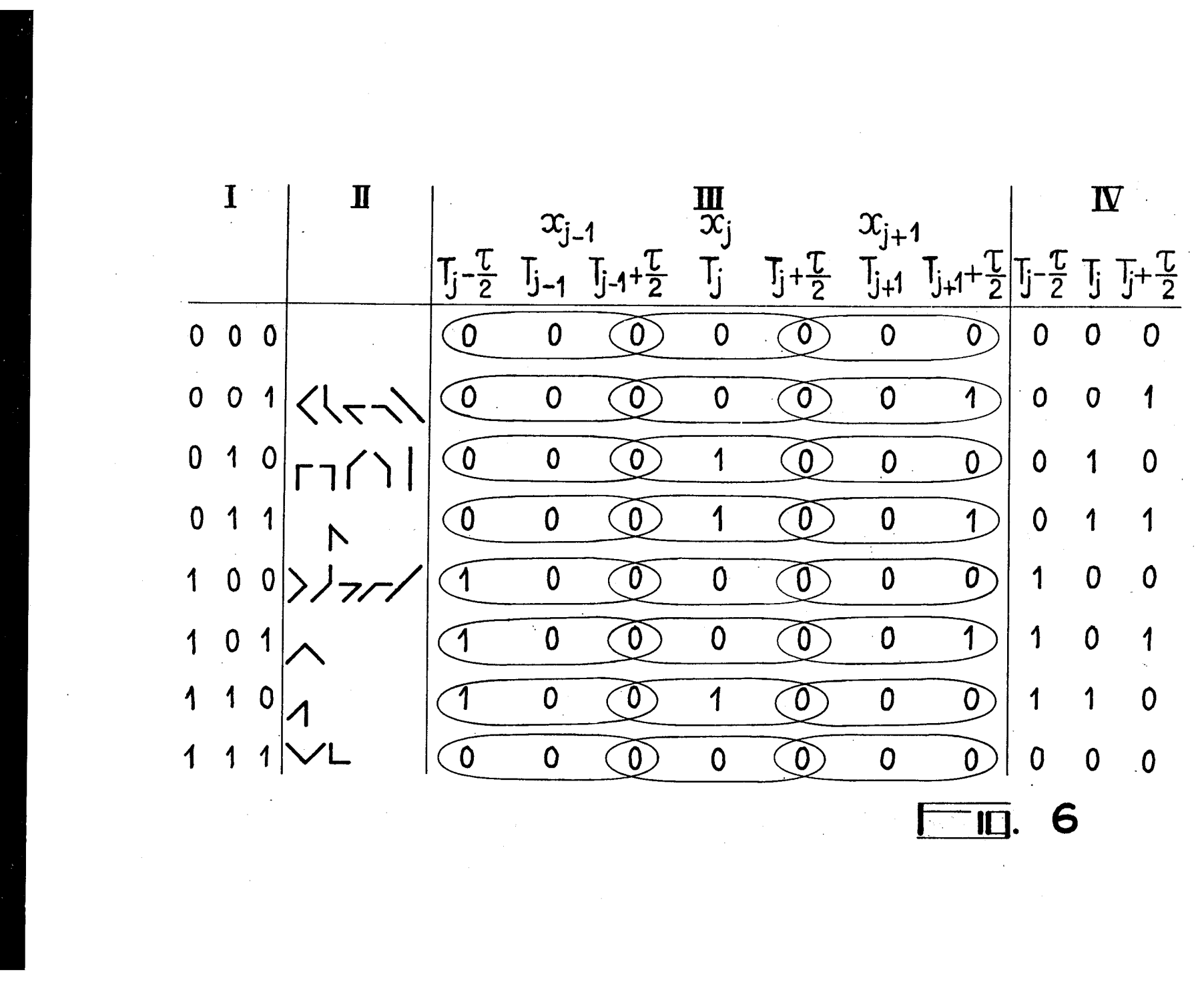

FIG. 6 shows the table of the orders in the three memories forming the assembly OB for three successive lines.

FIG. 7 shows the displacement of the addresses of the three memories.

FIG. 8 shows one embodiment of the three memories.

FIG. 1 is a block diagram of the interface logic according to the invention. It is distinguished from FIG. 7 of the above-mentioned Patent by the following differences, the reference 10 denoting the data processing system.

Figure 1:
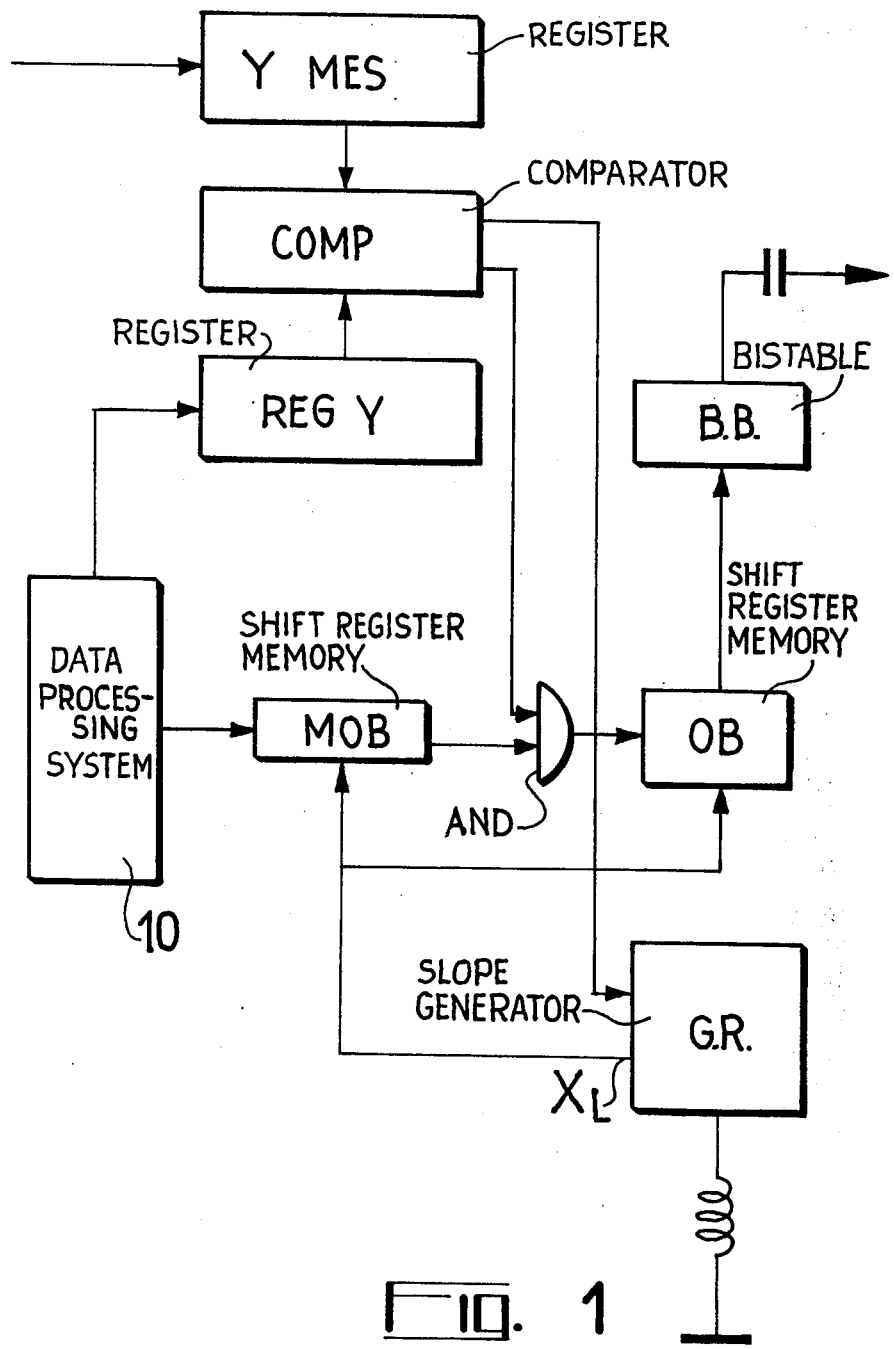
FIG. 1 is the improvement according to the invention of the logic circuit shown FIG. 7 of the cited Patent.

The modification logic which comes into operation for the so-called change lines, i.e. lines comprising an apex of the contour to be drawn, is directly connected to an assembly of shift register memories OB through the AND circuit ET and the assembly MOD is removed, the rest of the block diagram of FIG. 1 of the above-mentioned Patent being unchanged.

Figure 2:
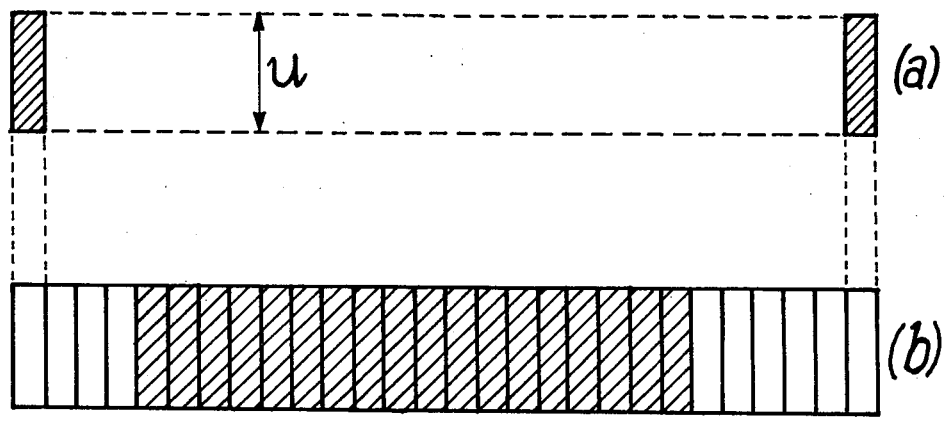
FIGS. 2 and 3 are respectively FIGS. 6 and 7 of the cited Patent.
Figure 3:
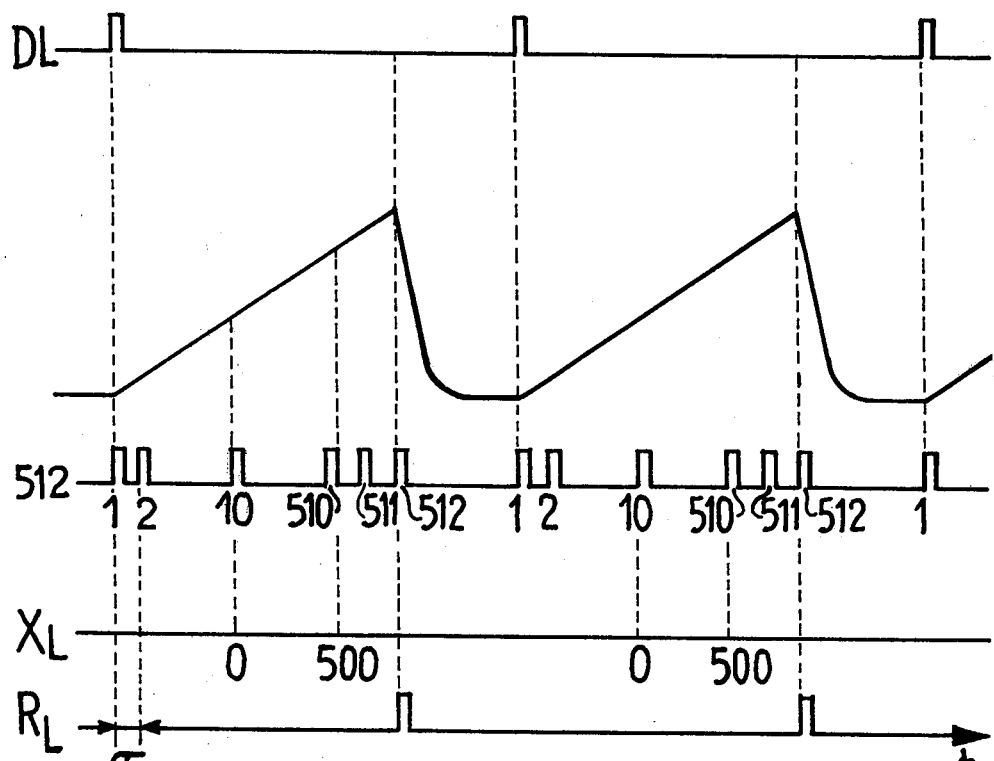

Accordingly, each elementary figure in FIG. 2 is as described in FIG. 6 of the Patent, the height of the rectangle (the distance between one line and the following line) is $\mu$, its width $\mu/4$ and this width determines the distance between one point $X_j$ written at the instant T and the following point $X_{j+1}$ written at the instant T + $\tau$ on the same line.

As in the Patent, the slope generator GR controls the X deflection coils which enables a line $Y_q$ to be drawn. As in the Patent the displacement in the OY direction is made mechanically and the slope generator, when triggered by the comparator COMP delivers on one part synchronizing pulses, and acts as a synchronizing clock.

During the sweeping of each line, it delivers pulses of predetermined period $\tau$, i.e. 512 pulses, of which 501 are effectively utilised and correspond to each point of the line. These pulses act as clock pulses and control the operation of the memories MOB and OB, in other words the successive addressings at the 20 times T, T + $\tau$ .... T + j$\tau$ .... T + 501$\tau$, of the points $X_1, X_2 ... X_j, X_{j+1} ... X_{501}$, i.e. the successive points of each line.

According to the invention, each time the addressed point is, for a line $Y_q$, a beginning of a contour or an end of a contour, the assembly of memories OB in the example described in the above-mentioned Application delivers a three-digit number indicative of the direction of the side of the polygon to be drawn. These three digits, 001, 010, 100 are respectively indicative of a slope inclined at 45° to the left, a so-called vertical slope (parallel to the displacement at Y) and of a slope inclined to the right. These three digits contain only one digit 1.

For a point reached at time T, three characteristic instants T − $\tau/2$, T, T + $\tau/2$ may be considered (FIG. 4).

In case 4 (a), i.e. the slope inclined to the left, the beam should be on (or off) at time T + $\tau/2$ In case 4 (b), at time T, In case 4 (c) at time T − $\tau/2$.

For the output numbers of the assembly OB, this gives the table shown in FIG. 5 which, for each origin point on a line of a contour, indicates the moment at which or the pulse in response to which the beam should on (or go off) in dependence upon the number issuing from OB.

If the number is 001, the pulse is produced at the time T + $\tau/2$, if the number is 010 the pulse is produced at the time T and, if the number is 100, the pulse is produced at the time T − $\tau/2$.

Thus, after having drawn the line $Y_q$, the beam is made to draw the line $Y_{q+1}$, i.e. the following line. Now, the line $Y_q$ has been drawn after the line $Y_{q-1}$ and before the line $Y_{q+1}$.

Assuming that the slope of the polygon is the same for 25 these three lines, it is obvious that the order 001 will have appeared for the line $Y_{q-1}$ at the abscissa $X_{j-1}$ and that it will appear at the line $Y_{q+1}$ at the abscissa $X_{j+1}$. Similarly, the order 010 will appear at the abscissa $X_j$ for the three lines, whilst the order 100 will appear at the abscissa $X_{j+1}$ for the line $Y_{q-1}$, at the abscissa $X_j$ for the line $Y_q$ and at the abscissa $X_{j-1}$ for the line $Y_{q+1}$.

The memory OB will be composed of three memories, namely (FIG. 8) the memory $M_{-1}$, the memory $M_0$ and the memory $M_1$. These memories are shift registers of which each stage contains a digit 0 or 1.

These memories shift at the rhythm of the clock (i.e. 10 slope generator). If, at the instant $T_j$ for the line $Y_q$, the stages $A_j$ of the memory $M_{-1}$, $B_j$ of the memory $M_0$ and $C_j$ of the memory $M_1$ are addressed for the writing of the point $X_j$, the addresses will be $A_{j+1}$, $B_j$, $C_{j-1}$ for the point abscissa $X_j$ of the line $Y_{q+1}$.

If the number in the binary code, formed by the three digits contained in the stages $A_j B_j$ and $C_j$ is 010, the stage $B_j$ contains the number 1 and the other stages the number 0.

If the number were 001, it would be the stage $C_j$ which would contain the number 1. For the line $Y_{q+1}$, this number 1 would appear at the address $C_{j+1}$ whilst the number 0 would reappear at the other two addresses $B_j$ and $A_{j-1}$.

Accordingly, the drawing of the line $Y_{q+1}$ may readily be deduced from that of the line $Y_q$ in cases where there is no change of slope from one line to the following line.

Consideration will now be given to the case where changes in slope occur, i.e. changes in the action of the logic MOB on the assembly OB in the cases of modification lines of which the definition may be found in the above-mentioned Patent.

In the event of a change in slope at the point $X_j$ of the line $Y_q$, the memory MOB again supplies a three-digit code number, just as in the above-mentioned, except that on this occasion the number supplied may contain the digit 1 twice and the digit 1 at least once. The table shown in FIG. 6 contains, the column I, numbers of codes issuing from the memory MOB, namely eight numbers in the binary code corresponding to the digits 0 to 7.

The corresponding apices are shown in column II. Column IV shows the orders given at the times $T_{j-\tau/2}$, $T_j$, $T_j + \tau/2$ to the address corresponding to the abscissa point $X_j$ for the drawing of the line $Y_q$.

Column III shows the orders given for the drawing of the following line $Y_{q+1}$ and introduced into the memory OB for the points $X_{j-1}$ (times $T_{j-1} - \tau/2$, $T_{j-1}$, $T_{j+1} + \tau/2$) (or, in other words, $T_j - \tau/2$ because $T_{j-1} = \tau$), $X_{j-1}$ (time $T_j$, $T_j + \tau/2$), $X_{j+1}$ (time $T_{j+1} + \tau/2$).

If the memory MOB delivers the order 000, the point $X_j$ in question is neither an apex of a polygon nor a point of the contour. In addition, this will also be the case for the point $X_j$ of the line $Y_{q+1}$ and the two points $X_{j-1}$ and $X_{j+1}$ of that line.

Case 001: the apices are those of column II.

The pulse is delivered to the bistable circuit at the time $T_j + \tau/2$.

For the line $Y_{q+1}$, the number 1 will appear at the address corresponding to $X_{j+1}$, the addresses corresponding to $X_{j-1}$ and $X_j$ respectively receiving 0's.

Accordingly, this will give the sequence of the signals represented for the line $Y_{q+1}$. Only the point $X_{j+1}$ will have a sequence 001 corresponding to a triggering pulse at the time $T_{j+1} + {}_2{}^\tau$.

Case 010: for the abscissa $X_q$ on the line being recorded, there will be a pulse at the time $T_j$(1 state of the address addressed at that moment in the $M_0$ memory). On the line $Y_{q+1}$, the memory $M_0$ at the same address will have 1 stage in the 1 state. The two other memories will have 0 states which is explained by the fact that this apex corresponds to the beginning of the vertical slope.

Case 011: the 1 state respectively prevails in the two memories $M_0$ and $M_1$ at the adress $X_j$ for the line $Y_q$.

The central memory retains the 1 state for the line $Y_q$ $_{+1}$ (vertical slope). Since the state of the memory $M_1$ has its address shifted to the right, the code 001 will reappear for the point $X_{j+1}$.

Case 100: the code 100 will be re-encountered at the point $X_{j-1}$ (beginning of a slope inclined to the left).

Case 101: on the line $Y_{q+1}$, the number 100 will be attributed to the point $X_{j-1}$ and the number 001 to the point $X_{j+1}$; on the line $Y_{q+1}$, a contour inclined to the right will be encountered at $X_{j-1}$ and a contour inclined to the left at $X_{j+1}$.

Case 110: the first digit 1 will be re-encountered at the point $X_{j-1}$, code 100. The digit 1 will remain at $X_j$(code 010); a slope inclined to the right will be encountered at $X_{j-1}$ and a vertical ramp at $X_j$.

Case 111: this case corresponds to the end of a contour on the following line they are only "0" states in the memories, the beam remains blanked.

FIG. 7 shows how the stages of the three memories are shifted for three successive points which each beginning-of-line pulse.

FIG. 8 is a block diagram of one example of the logic OB.

It comprises the three memories, $M_1$, $M_0$, $M_1$, these memories comprising stages or addresses equal in number to the number of points of each line. These stages all have the "0" or "1" state.

Accordingly, the first memory $M_1$ comprises the stages $A_0 \ldots A_{500}$, the second the stages $B_0 \ldots B_{500}$ and the third the stages $C_0 \ldots C_{500}$.

For writing a given line, the line $Y_q$, the memories are fixed by the output of the AND circuit ET in FIG. 1. The stages of equal rank are simultaneously addressed, i.e. for the line in question $A_1$ - $B_1$ - $C_1$, $A_2$ - $B_2$ - $C_2$, ... $A_{501}$, $B_{501}$, $C_{501}$.

At each instant, the stages of the same rank in the three memories have the "1" or "0" state and only one of them at most has the "1" state. If there is no "1" state, the beam remains on or off.

Accordingly, this only leaves the possibilities 001, 010, 100 which, as was seen earlier on, are slope codes.

For writing $Y_{q+1}$, an order arrives from the circuit ET, the stage $A_j$ takes the place of $A_{j-1}$, the stage $B_j$ does not move and the stage $C_j$ takes the place of $C_{j+1}$. The stages are addressed as before by the pulses of the slope generator.

The outputs of the stages are respectively connected to the first inputs of the circuits $AND_9$, $AND_{10}$ and $AND_{11}$ of which the outputs are connected to the respective first the outputs of the latter $OR_{-1}$, $OR_0$, $OR_1$ gates are applied respectively to three two state $B_{-1}$, $B_o$, $B_1$ inputs of a logic device.

Each input has the state of the corresponding gate output and the output is connected to the beam blanking system BB. This device delivers a pulse to this BB system at time $T - \tau/2$ and triggers them, when input $B_{-1}$ is in state "1", at time T, when input $B_0$ is in state "1", at time $T + \tau/2$ when input $B_1$ is in state "1".

One entire part of the Fig. functions without the intervention of the memory MOB. It applies its indicative digits in parallel to the three inputs of the inverter circuit AND 100 and the OR circuit $OR_{100}$. When it does not apply a digit 1, the circuit closes the AND circuits $AND_{-1}$, $AND_0$ and $AND_1$ and the system functions as before.

On the appearance of an apex of a change of code, the logic MOB directly applies its orders on the one hand to the electron beam through the circuits $OR_{-1}$, $OR_0$, $OR_1$.

The inverter circuit NAND 100 delivers a signal 0 which is transformed into "1" and is applied to the corresponding stages of the memories $M_{-1}$, $M_0$ and $M_1$ by the inverters $INV_{-1}$, $INV_0$ and $INV_1$.

Accordingly, the new code will be re-encountered at the corresponding stages during the writing of the line $Y_{q+1}$.

Accordingly, the same result as in the above-mentioned Application will have been obtained by a much simpler system.

What I claim is:

1. In an automatic device for forming programmed pattern by electron bombardment on a sample controlled by a data processing system, by forming upon the substrate an elementary rectangular image of a diaphragm, electronically controlled means for deflecting said image in a direction OX parallel to one of its sides, and scanning said sample line by line, mechanical displacing means in the OY direction perpendicular to OX a control electrode for modulating the beam intensity by all or nothing, a two stable state device controlling said electrode, an interface circuit controlled by said data processing system comprising a buffer memory and an assembly of memories, an improvement in said interface circuit consisting of a clock controlled slope generator having a period P, connected to said deflecting means for scanning each line and delivering in response N recurrent pulses numbered respectively $1 \ldots j \ldots N$ of period $P/N = \tau$ said assembly of memories comprising a central memory and a first and second shift register memory, each memory of said assembly, comprising N two stable state stages significant of digits "0" and "1", said pulse numbered j addressing simultaneously the stages $A_j$, $B_j$, $C_j$ respectively of said first, said central and said second memory, means connected to said stage output for triggering said two bistable state device at time $J\tau + \tau/2$ when the addressed stage Aj is in the "1" state, at time $j\tau$ when the addressed stage Bj is in the "1" state, at time $j\tau - \tau/2$ when stage Bj is in the "1" state.

2. A circuit as claimed in claim 1, wherein when passing from a line to the following one, the stage Aj of said first memory is shifted at rank j-1, the stage $B_j$ of said central memory remaining fixed, the stage $C_j$ is shifted at rank j+1 at most one of said stages having the "1" state.

3. A circuit as claimed in claim 2, wherein said stage connecting means comprise three OR circuit having first inputs respectively connected to said first memory, said center memory said second memory output stages, said buffer memory connected to said data processing system having addresses, and stages in the "1" or "0" at these adresses, said adresses corresponding to predetermined lines to be scanned, and to predetermined points in said lines, and at said adresses three two stable state stages, having triggering connection means respectively to the stages $A_j B_j C_j$ of said first central second memories at said adresses for said line, at least two of said three stages having the "1" state.

4. A device as claimed in claim 1, wherein said two stable state device is a logic circuit which has a first, a second and a third two stable input, and one output delivering pulses at times $j\tau \cdot - \tau/2$, $j\tau$ $j\tau + \tau/2$ when said first second and third inputs are in the "1" state.

* * * * *